(12) United States Patent
Malkiel et al.

(10) Patent No.: US 10,489,943 B2
(45) Date of Patent: Nov. 26, 2019

(54) SYSTEM AND METHOD FOR SPARSE IMAGE RECONSTRUCTION

(71) Applicant: GENERAL ELECTRIC COMPANY, Schenectady, NY (US)

(72) Inventors: Itzik Malkiel, Givaatayim (IL); Sangtae Ahn, Guilderland, NY (US); Christopher Judson Hardy, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 54 days.

(21) Appl. No.: 15/907,797

(22) Filed: Feb. 28, 2018

(65) Prior Publication Data
US 2019/0266761 A1    Aug. 29, 2019

(51) Int. Cl.
*A61B 5/00*    (2006.01)
*G06T 11/00*    (2006.01)
(Continued)

(52) U.S. Cl.
CPC ........ *G06T 11/008* (2013.01); *G01R 33/4822* (2013.01); *G01R 33/561* (2013.01); *G06T 2211/424* (2013.01)

(58) Field of Classification Search
CPC ................ A61B 5/00; A61B 6/00; G06T 7/00
(Continued)

(56) References Cited

U.S. PATENT DOCUMENTS 9,607,362 B2 * 3/2017 Baron ..................... G06T 5/002
9,817,093 B2 * 11/2017 Rothberg ........... G01R 33/3854
(Continued)

FOREIGN PATENT DOCUMENTS

CN    103646410 B    3/2014
CN    104779960 A    7/2015
(Continued)

OTHER PUBLICATIONS

Tang et al., "Performance Comparison Between Total Variation (TV)-Based Compressed Sensing and Statistical Iterative Reconstruction Algorithms", Institute of Physics and Engineering in Medicine, http://iopscience.iop.org/article/10.1088/0031-9155/54/19/008/meta, vol. 54, Sep. 9, 2009.
(Continued)

*Primary Examiner* — Abolfazl Tabatabai

(57) ABSTRACT

A method for sparse image reconstruction includes acquiring coil data from a magnetic resonance imaging device. The coil data includes undersampled k-space data corresponding to a subject. The method further includes processing the coil data using an image reconstruction technique to generate an initial undersampled image. The method also includes generating a reconstructed image based on the coil data, the initial undersampled image, and a plurality of iterative blocks of a flared network. A first iterative block of the flared network receives the initial undersampled image. Each of the plurality of iterative blocks includes a data consistency unit and a regularization unit and the iterative blocks are connected both by direct connections from one iterative block to the following iterative block and by a plurality of dense skip connections to non-adjacent iterative blocks. The flared network is based on a neural network trained using previously acquired coil data.

20 Claims, 6 Drawing Sheets

(51) Int. Cl.
  *G01R 33/48* (2006.01)
  *G01R 33/561* (2006.01)
(58) Field of Classification Search
  USPC .......................................................... 382/131
  See application file for complete search history.

(56) References Cited

U.S. PATENT DOCUMENTS

| | | |
|---|---|---|
| 2015/0187052 A1 | 7/2015 | Amroabadi et al. |
| 2016/0093048 A1 | 3/2016 | Cheng et al. |
| 2016/0187446 A1 | 6/2016 | Zhou et al. |
| 2016/0247299 A1 | 8/2016 | Tan et al. |
| 2017/0024634 A1 | 1/2017 | Miao et al. |
| 2017/0061620 A1 | 3/2017 | Park et al. |
| 2017/0160363 A1 | 6/2017 | Chen et al. |
| 2017/0169564 A1 | 6/2017 | Hansen et al. |
| 2017/0178365 A1 | 6/2017 | Raupach et al. |
| 2017/0243377 A1 | 8/2017 | Bauer et al. |
| 2017/0265952 A1 | 9/2017 | Donhowe et al. |
| 2017/0278301 A1 | 9/2017 | Peterson et al. |
| 2017/0293825 A1 | 10/2017 | Shao et al. |
| 2017/0309019 A1 | 10/2017 | Knoll et al. |
| 2018/0130202 A1 | 5/2018 | Wang et al. |

FOREIGN PATENT DOCUMENTS

| | | |
|---|---|---|
| CN | 104851101 A | 8/2015 |
| CN | 105069825 A | 11/2015 |
| CN | 105825509 A | 8/2016 |
| CN | 105931179 A | 9/2016 |
| CN | 105976318 A | 9/2016 |
| CN | 106056647 A | 10/2016 |
| CN | 106204449 A | 12/2016 |
| CN | 106373167 A | 2/2017 |
| CN | 106529555 A | 3/2017 |
| CN | 106683067 A | 5/2017 |
| CN | 106970343 A | 7/2017 |
| CN | 107064845 A | 8/2017 |
| CN | 107110930 A | 8/2017 |
| CN | 107110932 A | 8/2017 |
| CN | 107121654 A | 9/2017 |
| CN | 107182216 A | 9/2017 |
| EP | 3217872 A2 | 9/2017 |
| EP | 3223246 A1 | 9/2017 |
| WO | 2016037025 A1 | 3/2016 |
| WO | 2016037028 A1 | 3/2016 |
| WO | 2016172188 A1 | 10/2016 |
| WO | 2016182551 A1 | 11/2016 |
| WO | 2017039163 A1 | 3/2017 |
| WO | 2017083849 A1 | 5/2017 |
| WO | 2017100658 A1 | 6/2017 |
| WO | 2017106998 A1 | 6/2017 |
| WO | 2017113205 A1 | 7/2017 |

OTHER PUBLICATIONS

Krishnan et al., "Graph-Based Iterative Reconstruction of Sparse Signals for Compressed Sensing", International Conference on Telecommunication in Modern Satellite Cable and Broadcasting Services, http://ieeexplore.ieee.org/document/6112021/, Oct. 5-8, 2011.
Yuan et al., "Compressed Sensing Undersampled MRI Reconstruction Using Iterative Shrinkage Thresholding Based on NSST", International Conference on Signal Processing, Communications and Computing, http://ieeexplore.ieee.org/document/6986275/, Aug. 5-8, 2014.
J Schlemper, et al. A deep cascade of convolutional neural networks for MR image reconstruction. arXiv:1703.00555v1, Mar. 1, 2017.
K Hammernik, et al. Learning a variational network for reconstruction of accelerated MRI data. arXiv:1704.00447v1, Apr. 3, 2017.
S Diamond, et al. Unrolled optimization with deep priors. arXiv:1705.08041v1, May 22, 2017.
G Huang, et al. Densely connected convolutional networks. arXiv:1608.06993v4, Aug. 27, 2017 (Proceedings of CVPR 2017).
K. He, X. Zhang, S. Ren, and J. Sun. Deep residual learning for image recognition. arXiv:1512.03385v1, Dec. 10, 2016 (Proceedings of CVPR 2016).
EP application # 19157482.1; European Search Report dated Aug. 2, 2019; 10 pages.
Mardani Morteza et al: "Recurrent generative adversarial neural networks for compressive imaging", 2017 IEEE 7th International Workshop on Computational Advances in Multi-Sensor Adaptive Processing (CAMSAP), IEEE, Dec. 10, 2017 (Dec. 10, 2017), pp. 1-5, XP033328692, DOI: 10.1109/CAMSAP.2017.8313209 [retrieved on Mar. 9, 2018].
Tran Minh Quan et al: "Compressed Sensing MRI Reconstruction with Cyclic Loss in Generative Adversarial Networks", Arxiv.org, Cornell University Library, 201 Olin Library Cornell University Ithaca, NY 14853, Sep. 3, 2017 (Sep. 3, 2017), XP080818059.

* cited by examiner

SYSTEM AND METHOD FOR SPARSE IMAGE RECONSTRUCTION

BACKGROUND

Embodiments of the present specification relate generally to image reconstruction, and more particularly to systems and methods for reconstruction of undersampled magnetic resonance images.

Imaging techniques such as Magnetic Resonance Imaging (MM), require longer duration for raw data acquisition and high computation power for reconstruction of images from acquired raw data. Parallel imaging and compressed sensing techniques have been used to reduce MRI scan time by undersampling of k-space. Different spatial sensitivities of coil arrays and/or sparsity in the transform domain are exploited for undersampling of data during image acquisition. However, conventional MRI techniques provide reconstructed images with good image quality only for smaller undersampling factors, and image artifacts are pronounced when higher undersampling factors are employed.

Deep learning networks can be used for magnetic resonance (MR) image reconstruction from undersampled acquisition data. However, increasing the number of convolutional layers in deep neural networks may not improve the quality of the reconstructed image due to ineffective feature propagation. In compressed sensing methods using wavelets or total variation, the relative strengths of the sparsity and data consistency terms are adjusted in the cost function. When the sparsity term is too weak, residual aliasing is introduced in the reconstructed images. When the sparsity term is relatively strong, the reconstructed image appears unnaturally flat.

Acquisition of highly undersampled raw data in k-space enables faster imaging. However, the quality of the reconstructed image based on undersampled raw data must be comparable to fully sampled MR images. Image reconstruction techniques configured to generate an estimate of fully sampled MR images based on undersampled raw data in k-space are required. Specifically, newer architectures for convolution based deep learning networks are desirable.

BRIEF DESCRIPTION

In accordance with one aspect of the present specification, a method for sparse image reconstruction is disclosed. The method includes acquiring coil data from a magnetic resonance imaging device, wherein the coil data includes undersampled k-space data corresponding to a subject. The method further includes processing the coil data using an image reconstruction technique to generate an initial undersampled image. The method also includes generating a reconstructed image based on the coil data, the initial undersampled image, and a plurality of iterative blocks of a flared network. A first iterative block of the flared network receives the initial undersampled image. Each of the plurality of iterative blocks includes a data consistency unit and a regularization unit and the iterative blocks are connected both by direct connections from one iterative block to the following iterative block and by a plurality of dense skip connections to non-adjacent iterative blocks. The flared network is based on a neural network trained using previously acquired coil data.

In accordance with another aspect of the present specification, a system for sparse image reconstruction is disclosed. The system includes a database unit configured to store a flared network having a plurality of iterative blocks and previously acquired coil data. Each of the plurality of iterative blocks includes a data consistency unit and a regularization unit and the iterative blocks are connected both by direct connections from one iterative block to the following iterative block and by a plurality of dense skip connections to non-adjacent iterative blocks. The flared network is based on a neural network trained using previously acquired coil data. The system further includes a data acquisition unit configured to acquire coil data from a magnetic resonance imaging device. The coil data includes undersampled k-space data corresponding to a subject. The system also includes an image processing unit communicatively coupled to the data acquisition unit and configured to process the coil data using an image reconstruction technique to generate an initial undersampled image. The image processing unit is further configured to generate a reconstructed image based on the coil data, the initial undersampled image, and the flared network. A first iterative block of the flared network receives the initial undersampled image.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Figure 1:
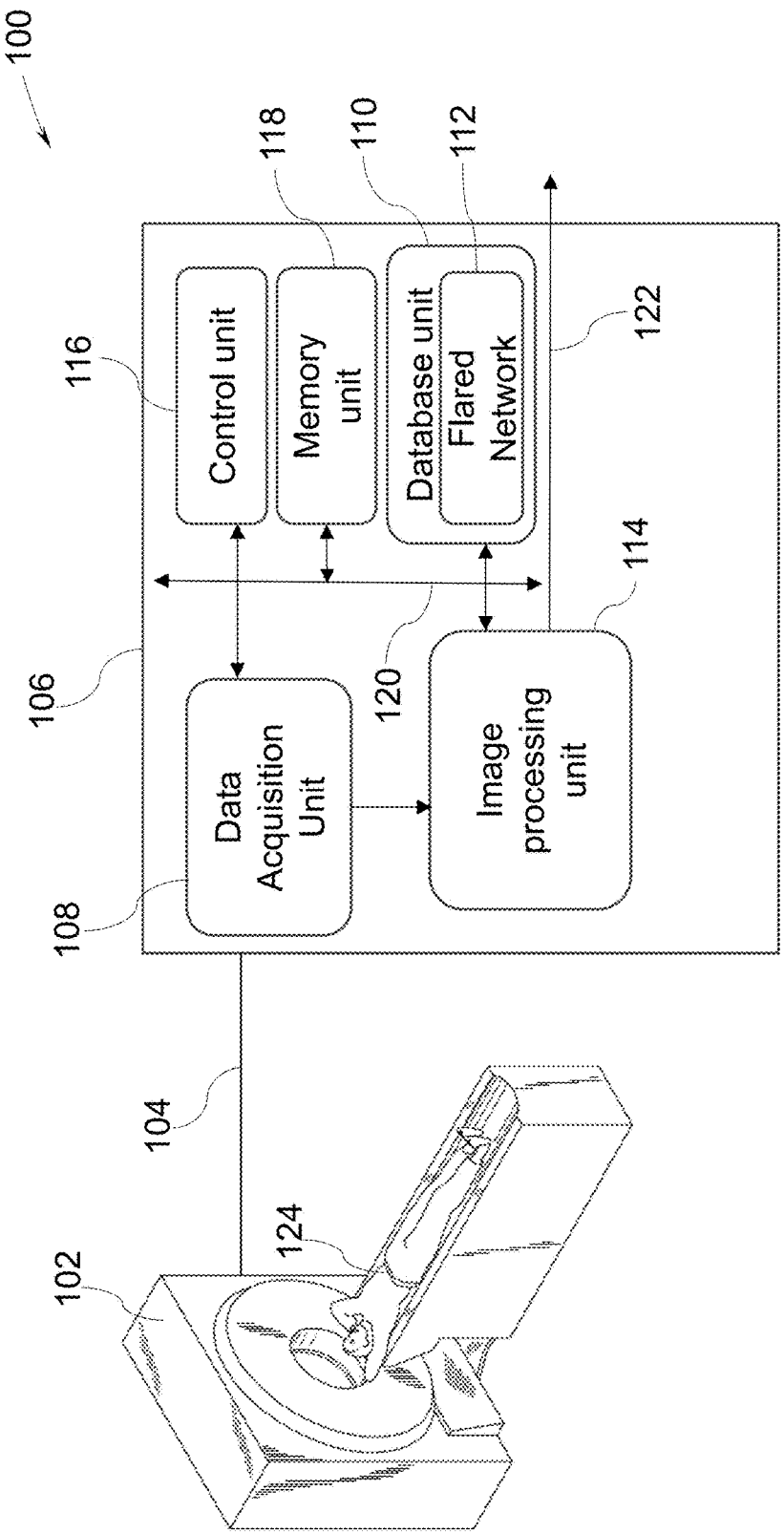
FIG. 1 is a diagrammatic illustration of a system for reconstructing images using a flared network in accordance with aspects of the present specification.

As will be described in detail hereinafter, systems and methods for image reconstruction, and more particularly systems and methods for reconstruction of magnetic resonance images are provided. Embodiments disclosed herein are configured for generating a fully sampled reconstructed image based on undersampled k-space raw dataset acquired from a magnetic resonance imaging (MRI) device using a flared network. The flared network disclosed herein includes a plurality of iterative blocks having dense skip connections from each iterative block to multiple subsequent iterative blocks. Each of the iterative blocks is configured to maintain data consistency between intermediate feature maps and the undersampled k-space raw dataset. Further, the iterative blocks are also configured to direct the flared network to obtain a feasible solution for an ill-posed optimization problem of reconstructing a fully sampled image from an undersampled input image generated from the undersampled k-space raw dataset.

The term "raw data" refers to data generated by an imaging device and the term "input dataset" refers to a plurality of two-dimensional spatial raw data corresponding to a plurality of MR coils. The term "k-space" refers to a vector space corresponding to the raw data acquired by an MR imaging device. The k-space may be considered as a 2D Fourier space and the MR images may be reconstructed using 2D inverse Fourier transformation. The k-space input dataset acquired from MR imaging device is also referred herein as "coil data". The term "undersampling" refers to subsampling or sampling the data at a fraction of the Nyquist sampling rate. Undersampling during data acquisition generates sparse data and the sparsity of the data is related to the undersampling factor. The term k-space refers to Fourier space in two dimensions (2D) or three-dimensions (3D) and the k-space data corresponds to Fourier transform of magnetic resonance (MR) image. The term "flared network" used herein refers to a deep learning image reconstruction network having a plurality of iterative blocks and configured to effectively propagate features across layers with use of dense skip connections. Specifically, in one embodiment, the deep learning network may be a convolution layer based network. The term "skip connection" refers to feeding of an output of an antecedent first iterative block as an input to a subsequent second iterative block with one or more iterative blocks in between the first iterative block and the second iterative block. The term "skip block" is used to refer to the antecedent first iterative block with reference to the subsequent second iterative block. The term "skip input" refers to an input to an iterative block from a skip block. The term "intermediate feature map" is used to refer to an output of an iterative block in the flared network. The term "data consistency" refers to maintaining fidelity of coil data in the output of an iterative block. The term "regularization" refers to modifying an ill-posed optimization problem to have a feasible solution. The term "regularization term" is used to refer to an additional term in the cost function of an optimization problem that enables generation of a feasible optimal solution. The term "fully sampled image" is used to refer to an image reconstructed from k-space data sampled at the Nyquist sampling rate. The term "undersampled image" or "subsampled image" is used to refer to an image reconstructed from undersampled k-space data.

FIG. 1 is a diagrammatic illustration of an imaging system 100 configured to provide faster image acquisition in accordance with aspects of the present specification. The imaging system 100 includes an imaging device 102 configured to acquire input dataset 104 corresponding to a subject 124. In one embodiment, the imaging device 102 corresponds to a magnetic resonance imaging (MRI) device. Further in this embodiment, the input dataset 104 corresponds to coil data generated by a plurality of radio frequency coils configured to transmit/receive RF signal to/from an organ of interest in the subject 124. In the case of MRI device, the coil data includes undersampled k-space data. In one embodiment, the undersampling factor of four is used to generate the coil data. However, other undersampling factors may also be used during acquisition of the coil data. Undersampling of k-space data provides sparsity to the input dataset 104. Sparse input dataset 104 enables faster acquisition (or equivalently, reduced scanning duration) and faster reconstruction of MR images. The imaging system 100 further includes an image reconstruction subsystem 106 communicatively coupled to the imaging device 102 and configured to reconstruct images based on sparse data such as input dataset 104 using a flared network.

The image reconstruction subsystem 106 includes a data acquisition unit 108, a database unit 110, an image processing unit 114, a control unit 116, and a memory unit 118 communicatively coupled to each other via a communications bus 120. The database unit 110 further includes a flared network 112 configured to generate a high-fidelity image from sparse data such as input dataset 104. Specifically, the flared network 112 is based on a trained neural network.

The data acquisition unit 108 is communicatively coupled to the imaging device 102 and configured to acquire input dataset 104. In the case of MR imaging device, the input dataset 104 corresponds to coil data generated from a plurality of receiver coils. In one embodiment, the coil data represented by the input dataset 104 is acquired from eight receiver coils with an undersampling factor of four. The data acquisition unit 108 may include analog to digital converter, pre-processing modules, data conditioning units and timing circuitry required to process the input dataset 104. The data acquisition unit 108 is further configured to store the input dataset 104 in the database unit 110. The data acquisition unit 108 is also configured to retrieve previously acquired/stored coil data from the database unit 110 for training the flared network 112.

The database unit 110 is communicatively coupled to the data acquisition unit 108 and configured to store input datasets acquired at previous time instants, the flared network 112 and other related data. The flared network 112 includes a plurality of iterative blocks coupled to one another with a cascade connection. Each iterative block includes a data consistency unit and a regularization unit, and each of the fourth through final iterative blocks is configured to process a plurality of skip inputs. Specifically, most of the plurality of iterative blocks are connected both by direct connections from one iterative block to the following iterative block and by a plurality of dense skip connections to non-adjacent iterative blocks. The data consistency unit is configured to preserve the fidelity of the coil data in the output of the corresponding iterative block. The regularization unit is configured to generate regularization information based on the plurality of skip inputs. Further, the regularization unit is configured to reduce generalization error in the output of the corresponding iterative block based on the regularization information. The regularization unit includes a plurality of convolution layers, a plurality of bias layers and a plurality of leaky ReLU layers. The convolution layer is configured to generate feature maps using a plurality of spatial filters. The bias layer is configured to improve the modelling capability of the regularization unit and the leaky ReLU layer is a leaky version of a Rectified Linear Unit (ReLU) configured to improve propagation of gradients while providing an iterative solution to the optimization problem. The regularization unit is configured to minimize generalization error in the output of the corresponding iterative block. Specifically, the flared network 112 includes structural parameters of the flared network such as, but not limited to, number of iterative blocks, numbers of filters and size of filters used for generation of feature maps, number of skip connections and number of convolution layers used in regularization units. The flared network 112 also includes parameter values of data consistency units and parameter values of regularization units. The parameter values of a regularization unit include parameter values of the filters used for generation of feature maps, bias values and activation layer parameters. Further, the database unit 110 also includes parameter values corresponding to consistency units and the transformation used by the data consistency units. The database unit 110 is also configured to store intermediate outputs of the regularization units such as feature maps, biased featured maps and rectification layer outputs. The database unit 110 also includes ground truth images corresponding to undersampled k-space input datasets acquired at previous instants.

The image processing unit 114 is communicatively coupled to the data acquisition unit 108 and the database unit 110 and configured to process the input dataset 104 using the flared network. The image processing unit 114 is configured to generate the reconstructed image 122 based on the input dataset 104. Specifically, the image processing unit 114 is configured to generate an initial undersampled image based on the coil data represented as the input dataset 104 using an image reconstruction technique. Further, the image processing unit 114 is configured to generate the reconstructed image 122 based on the coil data represented as the input dataset 104, the initial undersampled image and the flared network 112. The image processing unit 114 provides the initial undersampled image to a first iterative block of the flared network 112. In one embodiment, the initial undersampled image is a complex composite image. The first iterative block is configured to generate a first block output based on the initial undersampled image and the coil data. The first block output is provided via a direct connection to a second iterative block as a direct input and as a skip input via a dense skip connection to a plurality of subsequent iterative blocks such as but not limited to third iterative block and a fourth iterative block. In general, the dense skip connections fan forward from output of each of at least some of the iterative blocks to a predetermined number of subsequent iterative blocks beyond the respective following iterative block. In one embodiment, the predetermined number of subsequent iterative blocks may be specified by a user. In another embodiment, the predetermined number of subsequent iterative blocks may also be determined during generation of the flared network 112.

In one embodiment, the image processing unit 114 is configured to operate in an offline mode to generate the flared network 112 corresponding to a specific input dataset stored in the database unit 110. Specifically, the image processing unit 114 is configured to train the flared network 112 based on training dataset and corresponding ground truth images. The training dataset includes labelled coil datasets and the ground truth images corresponding to the labelled coil data representative of full sample reconstructed images. In one embodiment, the image processing unit 114 is configured to receive previously acquired substantially fully-sampled coil data from a database unit. The fully-sampled coil data may be acquired from an Mill device and stored in the database unit 110. Further, the image processing unit 114 is configured to reconstruct the substantially fully-sampled coil data to generate ground truth images corresponding to the previously acquired coil data. The image processing unit 114 is also configured to retrospectively undersample the substantially fully-sampled coil data to generate corresponding input data to the flared network. The undersampled input data to the flared network and the corresponding ground truth images are used as training dataset to train the flared network.

Further, any of well-known deep learning training techniques may be employed by the image processing unit to train the flared network 112 based on the training dataset. During the training, one or more structural parameters of the flared network may also be varied to determine optimal structure for the flared network. Specifically, the image processing unit 114 is configured to determine a plurality of parameters corresponding to the data consistency unit and the regularization unit of the plurality of iterative blocks by training the flared network to create output images that are similar to the corresponding ground truth images. Further, the image processing unit 114 is configured to store the trained flared network in the database unit 110.

The control unit 116 is communicatively coupled to one or more of the data acquisition unit 108, image processing unit 114, database unit 110 and the memory unit 118 and configured to initiate and/or control their operation. Although the control unit 116 is shown as a separate unit, in some embodiments, the control unit 116 may also be a part of the data acquisition unit 108 and the image processing unit 114. The control unit 116 may include one or more processors either co-located within in a single integrated circuit or distributed in multiple integrated circuits networked to share data and communication in a seamless manner. The control unit 116 includes at least one arithmetic logic unit, a microprocessor, a microcontroller, a general-purpose controller, a graphics processing unit (GPU) or a processor array to perform the desired computations or run the computer program.

The memory unit 118 is communicatively coupled to the control unit 116 and configured to store programs, operating systems and related data required by the control unit 116. Although the memory unit 118 is shown as separate unit, the memory unit 118 may be a part of the control unit 116, the image processing unit 114 or the database unit 110. In one embodiment, the memory unit 118 may be a dynamic random-access memory (DRAM) device, a static random access memory (SRAM) device, flash memory or other memory devices. In another embodiment, the memory unit may include a non-volatile memory or similar permanent storage device, media such as a hard disk drive, a floppy disk drive, a compact disc read only memory (CD-ROM) device, a digital versatile disc read only memory (DVD-ROM) device, a digital versatile disc random access memory (DVD-RAM) device, a digital versatile disc rewritable (DVD-RW) device, a flash memory device, or other non-volatile storage devices. The memory unit 118 may also be a non-transitory computer readable medium encoded with a program to instruct the one or more processors to generate the reconstructed image based on undersampled k-space data.

Figure 2:
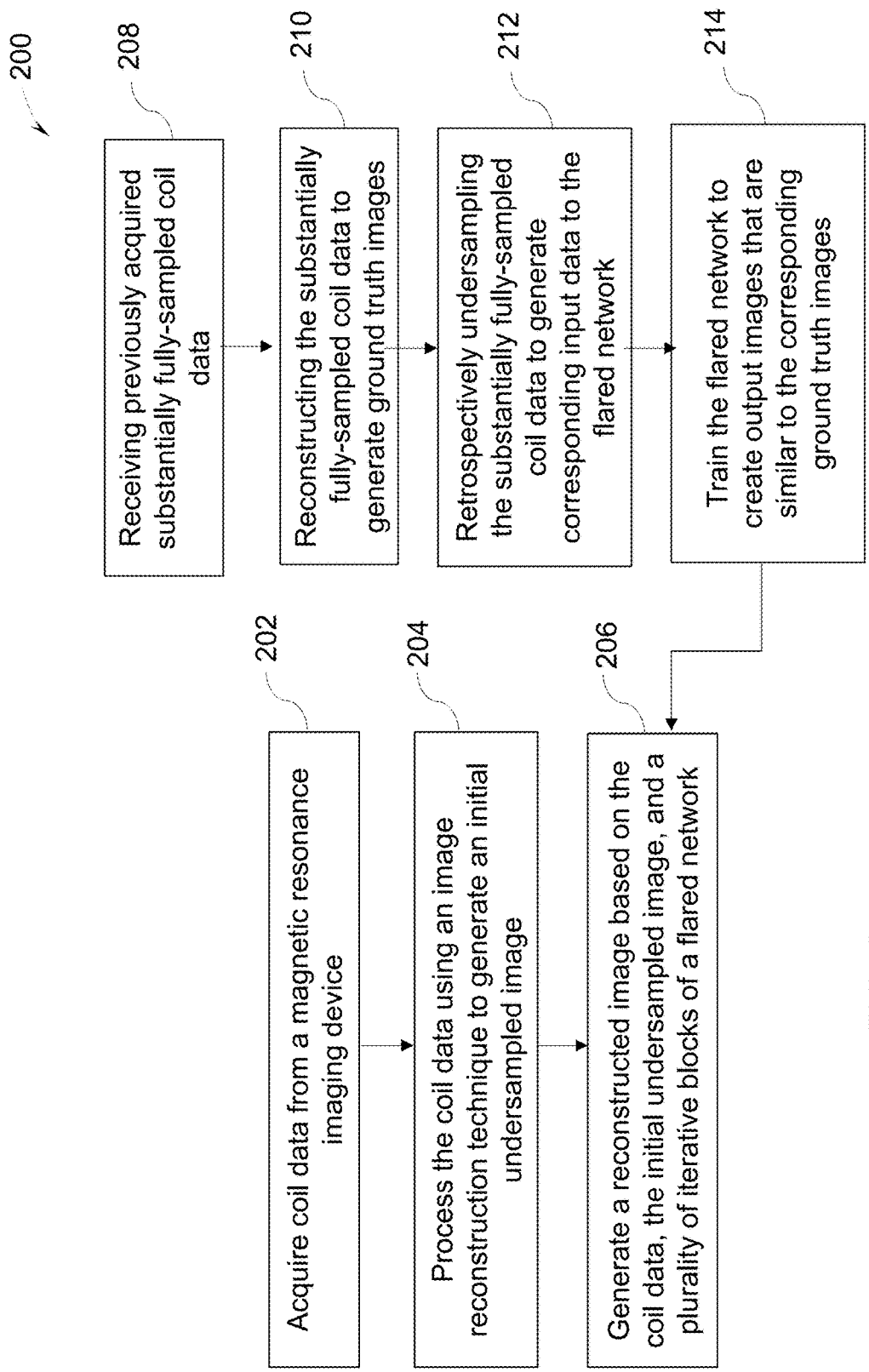
FIG. 2 is a flow chart illustrating a method for reconstructing images using a flared network in accordance with aspects of the present specification.

FIG. 2 is a flow chart illustrating a method 200 for reconstructing images using a flared network in accordance with aspects of the present specification. The method 200 includes acquiring coil data from a magnetic resonance imaging device at step 202. The coil data comprises undersampled k-space raw data corresponding to a subject 124. The coil data may be generated by an eight receiver coils of an MR imaging device and an undersampling factor of 4 may be used while acquiring the coil data.

The method 200 also includes processing the coil data using an image reconstruction technique to generate an initial undersampled image in step 204. The image reconstruction technique may include any suitable technique with one example comprising 2D inverse Fourier transformation, accounting for coil sensitivities and using a method for combining the coil data to generate a complex reconstructed image.

The method 200 further includes generating a reconstructed image based on the coil data, the initial undersampled image, and a plurality of iterative blocks of a flared network at step 206. Each of the plurality of iterative blocks includes a data consistency unit and a regularization unit. The flared network is based on a neural network trained using previously acquired coil data. In one embodiment, about sixteen iterative blocks may be used in the flared network. The iterative blocks are connected both by direct connections from one iterative block to the following iterative block and by a plurality of dense skip connections to non-adjacent iterative blocks. Each of the data consistency units is configured to preserve the fidelity of coil data in output of the corresponding iterative block. The regularization unit is configured to direct the reconstruction of MR image as a feasible solution of the optimization problem solved by the flared network.

Specifically, the step 206 includes determining the reconstructed image includes preserving fidelity of the coil data in output of each of the plurality of iterative blocks based on a corresponding data consistency unit. Further, the step 206 also includes generating regularization information to reduce generalization error in output of each of the plurality of iterative blocks based on a corresponding regularization unit. In one embodiment, the regularization information is generated by processing the direct input from the previous iterative block and a plurality of skip inputs using a convolution network. The convolution network used for generating the regularization information includes a plurality of processing stages and each of the plurality of processing stage includes a convolution layer, a bias layer and a ReLU (Rectified Linear Unit) layer. In one embodiment, a leaky version of the ReLU layer configured to improve propagation of gradients while providing an iterative solution to the optimization problem. Specifically, the convolution network includes a plurality of convolution layers, a plurality of bias layers and a plurality of leaky ReLU layers. In one embodiment, the flared network includes 16 iterative blocks and the regularization information is determined based on five skip inputs. In such embodiments, the regularization unit may include five convolution layers and the convolution layers may be configured to generate feature maps using eight, twelve, twenty, or forty filters.

In one embodiment, the method 200 further includes receiving previously acquired substantially fully-sampled coil data from a database unit at step 208. Further, the method 200 includes reconstructing the substantially fully-sampled coil data to generate ground truth images corresponding to the previously acquired coil data at step 210. At step 212, the method 200 also includes retrospectively undersampling the substantially fully-sampled coil data to generate corresponding input data to the flared network. Further, the method 200 includes determining a plurality of parameters corresponding to the data consistency unit and the regularization unit of the plurality of iterative blocks by training the flared network to create output images that are similar to the corresponding ground truth images at step 214. The method 200 also includes storing the flared network in the database unit.

Figure 3:
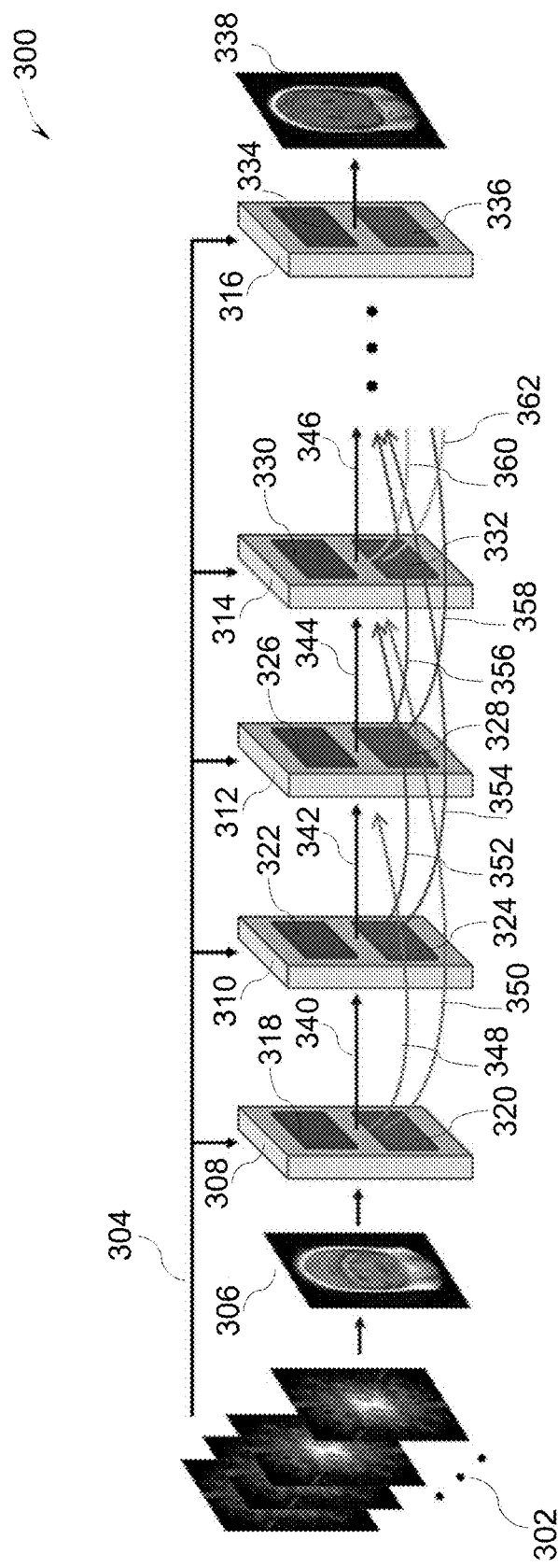
FIG. 3 is a block diagram illustrating a flared network used for reconstructing images in accordance with aspects of the present specification.

FIG. 3 is a schematic 300 of a flared network used for reconstructing images in accordance with aspects of the present specification. The schematic 300 includes coil data 302 representative of input dataset 104 of FIG. 1. In the illustrated embodiment, the coil data 302 are two-dimensional k-space datasets from a plurality of coils. The schematic 300 further includes a plurality of iterative blocks including iterative blocks 308, 310, 312, 314 and 316 forming a flared network 112 of FIG. 1. Each of the iterative blocks of the flared network of the illustrated embodiment provides two dense skip connections. The flared network of schematic 300 receives the coil data 302 as input to the iterative blocks including iterative blocks 308, 310, 312, 314, 316. The first iterative block 308 further receives an initial undersampled image 306 generated based on the coil data 302. The first iterative block 308 is configured to generate a first iterative block output based on initial undersampled image 306 and the coil data 302. The first iterative block output is provided to the second iterative block 310 as a direct input by a direct connection 340. Further, the first iterative block output is also provided as skip inputs to subsequent iterative blocks such as 312 and 314 through dense skip connections 348 and 350 respectively. The second iterative block 310 is configured to generate a second iterative block output based on the first iterative block output 340 and the coil data 304. The third iterative block 312 is configured to receive the second iterative block output through a direct connection 342 and the first iterative block output through a dense skip connection 348. The second iterative block 312 is also configured to receive the coil data 302 and generate a third iterative block output. The iterative block 316 is configured to generate a final iterative block output 338 based on an iterative block output through a direct connection of its adjacent preceding iterative block (not shown), as well as iterative block outputs from dense skip connections of iterative blocks preceding that adjacent preceding iterative block and the coil data 304. In the illustrated embodiment, the iterative block 314 is configured to receive three iterative block outputs 344, 350, 352 generated from previous iterative blocks. The iterative blocks 308, 310 are referred to as skip blocks with reference to the iterative block 314. The outputs of iterative blocks 308, 310 are skip inputs with reference to the iterative block 314.

As stated previously, each of the plurality of iterative blocks 308, 310, 312, 314, 316 includes a data consistency unit and a regularization unit. Specifically, the iterative block 308 includes a data consistency unit 318 and regularization unit 320. The iterative block 310 includes a data consistency unit 322 and a regularization unit 324. The iterative block 312 includes a data consistency unit 326 and a regularization unit 328. Similarly, the iterative block 314 includes a data consistency unit 330 and a regularization unit 332 and the iterative block 316 includes a data consistency unit 334 and a regularization unit 336. The data consistency units 318, 322, 326, 330, 334 are configured to preserve fidelity of coil data in the respective iterative block outputs. The regularization units 320, 324, 328, 332, 336 are configured to generate regularization information based on a plurality of skip inputs. The regularization information is representative of additional information required to reduce generalization error in output of each of the iterative blocks.

In one embodiment, the flared network of schematic 300 includes sixteen iterative blocks, with five skip connections per block. In such an embodiment, each iterative block (such as the iterative block 314 in the figure) receives up to six iterative block outputs generated from previous iterative blocks. One among the six iterative block outputs is an iterative block output from immediate predecessor iterative block via a direction connection and the remaining five iterative block outputs are skip inputs received via dense skip connections. The coil data 302 in such an embodiment, may be generated from an MRI device having eight receiver coils. Other configurations for the flared network in other embodiments are envisaged. In such embodiments, the flared network of schematic 300 may include 10 or 50 iterative blocks with 5 or 20 dense skip connections. The convolution network in each of the iterative block may include 3 or 10 convolution layers and each of the convolution layers may be using 10 or 30 filters for generating intermediate feature maps.

Figure 4:
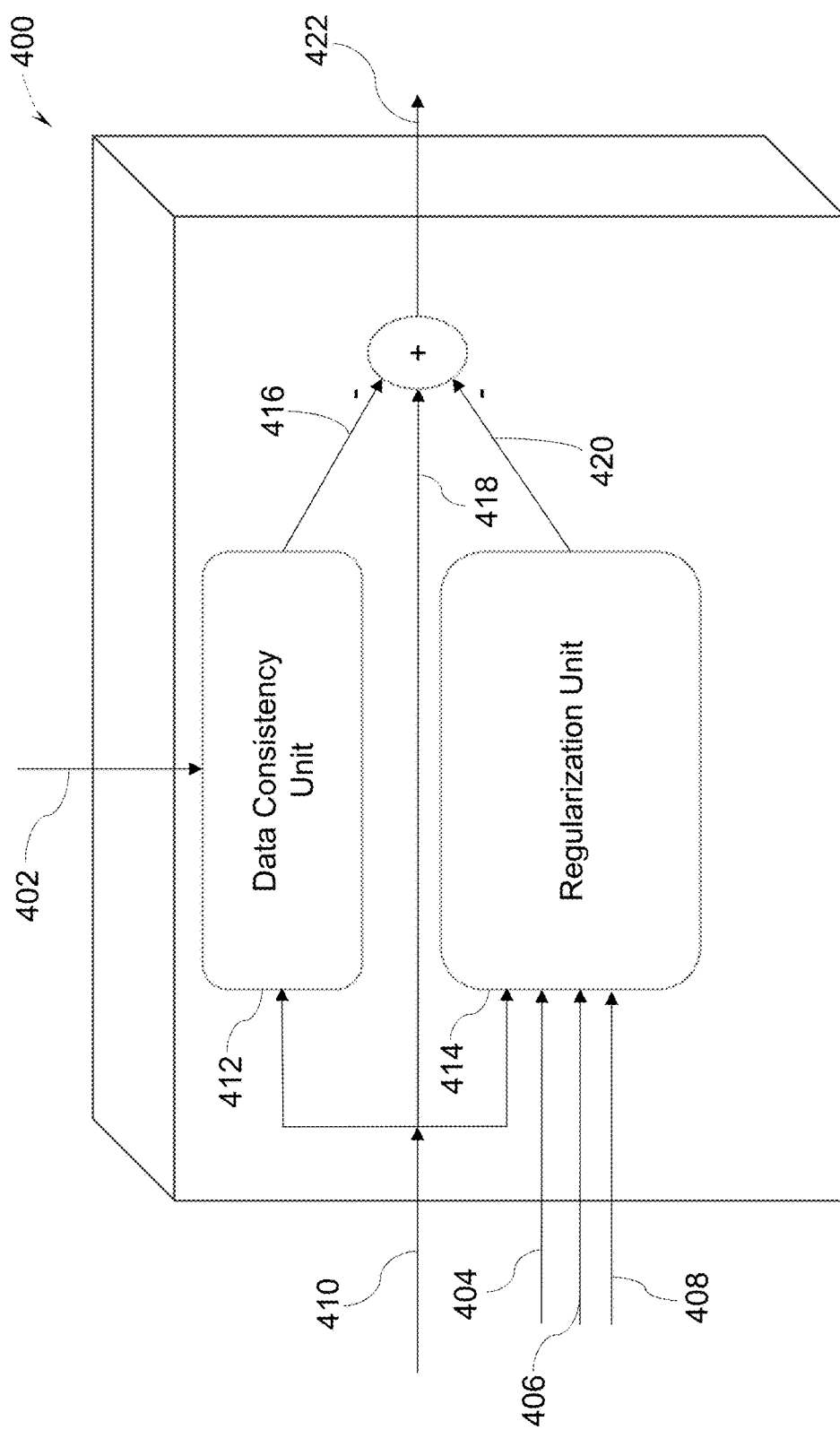
FIG. 4 is a block diagram of an iterative block used in flared network of FIG. 3 in accordance with aspects of the present specification.
Figure 5:
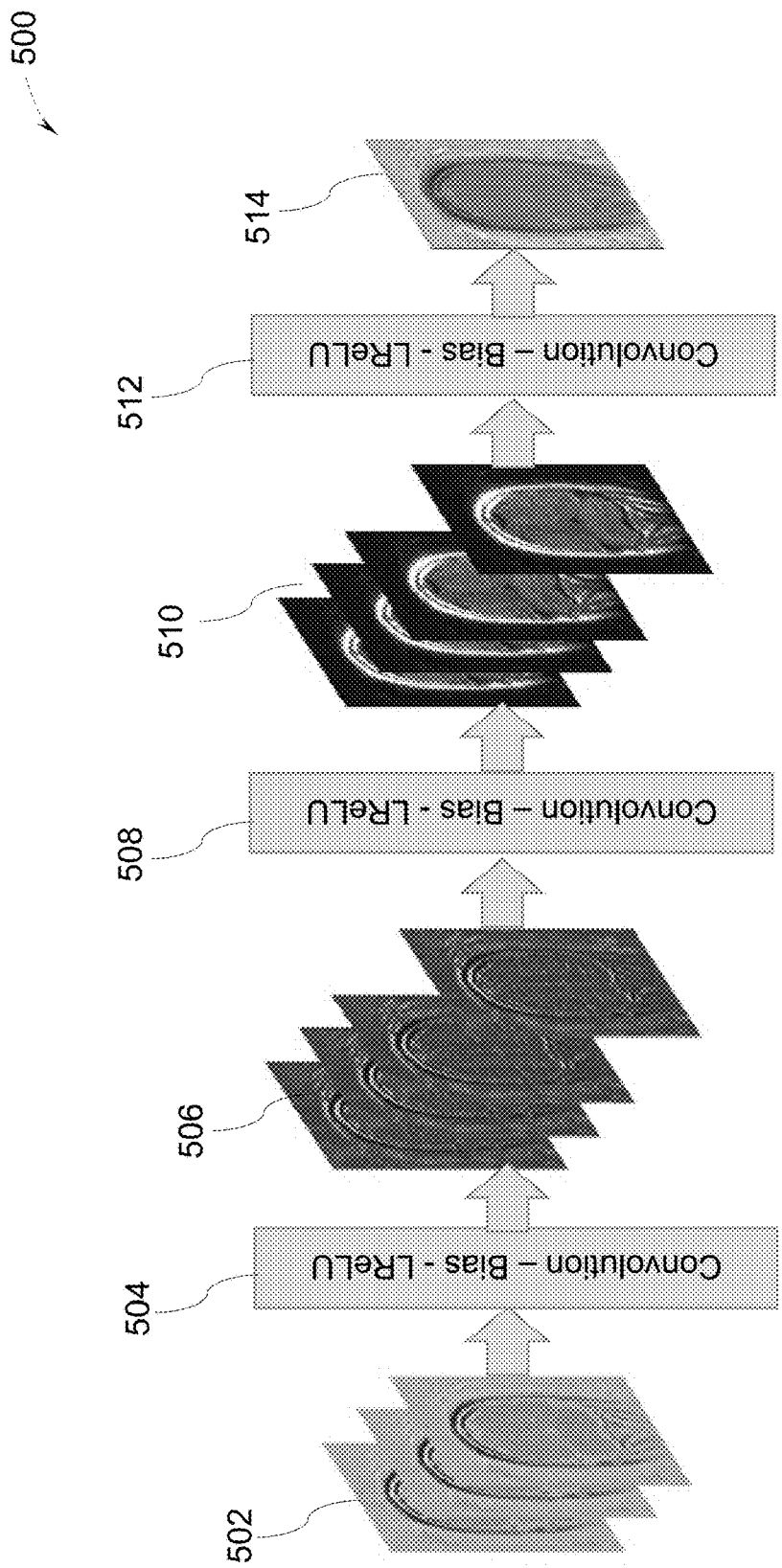
FIG. 5 is a block diagram of a regularization unit used in flared network of FIG. 3 in accordance with aspects of the present specification.
Figure 6E:
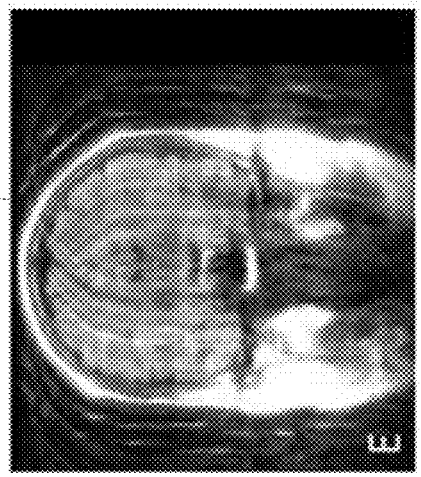
FIGS. 6A-6E illustrate superior performance of the flared network used for reconstruction of images in accordance with aspects of the present specification.
Figure 6B:
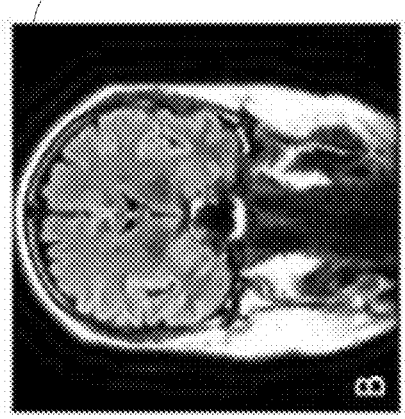
Figure 6D:
Figure 6A:
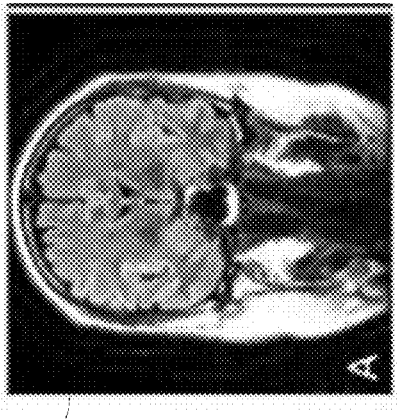
Figure 6C:
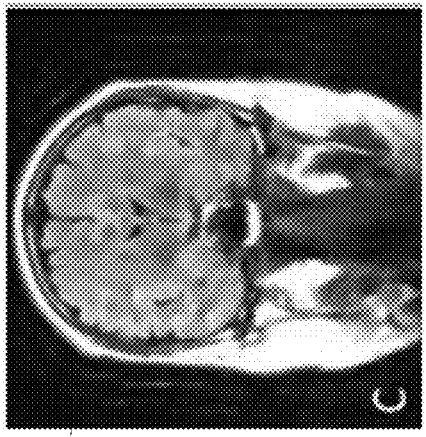

FIG. 4 is a block diagram of an iterative block 400 used in the flared network of FIG. 3 in accordance with aspects of the present specification. The iterative block 400 provides an iterative solution to image reconstruction formulated as an optimization problem. The iterative block 400 includes a data consistency unit 412 configured to receive a first input 410 which is an iterative block output from a previous iterative block such as 340 of FIG. 3. Further, the data consistency unit 412 is configured to receive coil data 402 (equivalent of 304 in FIG. 3). Further, the data consistency unit 412 is configured to generate a first output 416 representative of a correction required to maintain data consistency in the first input 410. The iterative block 400 also includes a regularization unit 414 configured to receive the first input 410 and a plurality of iterative block outputs 404, 406, 408 as skip inputs from three skip blocks with reference to the iterative block 400. In one embodiment, the regularization unit 414 is a deep learning convolution neural network as explained in a subsequent paragraph with reference to a subsequent figure (FIG. 5). The regularization unit 414 is configured to generate regularization information 420 based on the iterative block outputs 404, 406, 408 used as skip inputs. The regularization information 420 is representative of additional information required to determine a valid solution to an ill-posed optimization problem. The regularization unit 414 is able to propagate features across multiple iterative blocks to generate regularization information 420. Specifically, in one embodiment, the regularization information 420 is representative of smoothness of a loss function used in the optimization problem. In another embodiment, the regularization information 420 is representative of vector space norm. In some embodiments, the regularization information 420 may be representative of a measure of prior distribution, a sparsity measure or a measure of generalization with reference to the loss function of the optimization problem.

In one embodiment, the data consistency unit 412 is configured to generate an output given by:

$$\lambda^n A^*(Au^n - f) \qquad (1)$$

where, n is representative of index of the iterative block corresponding to the data consistency unit 412, $\lambda^n$ is a weighing parameter corresponding to the index n, A is representative of a transformation of data from image space to k-space. Specifically, the transformation represented by matrix A includes multiplying by coil sensitivities, applying two-dimensional FFT and multiplication by sampling pattern. The term un is representative of an image generated from nth iterative block such as 410 in FIG. 4. The term A* is an adjoint operator corresponding to A. Specifically, the adjoint operator A* includes a two-dimensional FFT operation followed by correcting a plurality of images of the coil data with corresponding coil sensitivity functions and then combining the plurality of images into a single image. The term f is representative of M-coil undersampled k-space data such as 402 of FIG. 4.

FIG. 5 is a schematic of deep learning network 500 used in regularization network of FIG. 4 in accordance with aspects of the present specification. In the illustrated embodiment, the deep learning network 500 is a convolution neural network. The deep learning network 500 is configured to receive a plurality of input images 502 from a plurality of previous iterative blocks and generate a reconstructed image 514. The deep learning network 500 includes a plurality of stages 504, 508, 512. Each of the plurality of stages 504, 508, 512 includes a feature generator, a bias provider and an activation layer. In one embodiment, the feature generator is a convolutional layer having a plurality of filters. The feature generator is configured to generate a plurality of feature maps based on the plurality of input images. The bias provider is configured to receive the plurality of feature maps and generate a plurality of biased feature maps. The activation layer is configured to receive the plurality of biased output feature maps and generate one or more output images. The plurality of stages includes a first stage 504, a second stage 508 and a third stage 512. The first stage 504 is configured to process the plurality of input images 502 to generate a first plurality of output images 506. The plurality of input images 502 is an output of one of an immediately preceding iterative block or a skip block of an iterative block having the deep learning network 500. The second stage 508 is configured to process the first plurality of output images 506 and generate a second plurality of output images 510. The third stage 512 is configured to process the second plurality of output images 510 to generate the reconstructed image 514. In one embodiment, about twelve filters are used to generate the first plurality of output images 506 and the second plurality of output images 510. Although only three stages are illustrated in the embodiment of FIG. 5, ten or more stages may be used to process skip inputs in each regularization unit such as 330 in FIG. 3.

FIGS. 6A-6E are images 602, 604, 606, 608, 610 illustrating superior performance of the flared network used for reconstruction of images in accordance with aspects of the present specification. The image 602 corresponds to a ground truth image sampled at Nyquist sampling rate. The image 602 has good fidelity and is used as a reference image to compare the reconstructed image from a flared network and reconstructed images from other prior art techniques. The image 604 is a reconstructed image obtained from a flared network in accordance with an exemplary embodiment of the present application. The image 606 is a reconstructed image obtained using total variation technique. The image 608 is a reconstructed image obtained using Autocalibrating Reconstruction for Cartesian imaging (ARC) technique. The image 610 is a reconstructed image obtained from zero-filling technique. It may be noted that the image 604 obtained from the flared network is perceptually superior compared to other images 606, 608 and 610. Further, relative Mean Square Error (rMSE) values and structural similarity index (SSIM) values are computed for images 604, 606, 608, 610 with reference to the ground truth image 602. The rMSE value for the image 604 is equal to 0.4 much lower than rMSE values (above 1.5) for other images 606, 608, 610 indicative of better performance of flared network. Similarly, SSIM value for image 604 is higher (about 0.95) compared to lower SSIM values (less than 0.9) corresponding to images 606, 608, 610 indicating better perceptual performance of the flared network.

The disclosed technique of reconstruction of magnetic resonance images from undersampled k-space coil data using the flared network provides higher quality images. Dense skip connections provided by the flared network from each iterative block to multiple subsequent iterative blocks are able to alleviate the vanishing-gradient problem encountered in deep neural networks. The flared network with dense skip connections is able to effectively propagate features across iterative blocks of a much deeper convolutional network. The flared network is configured to concatenate features of neighboring iterative blocks enabling enhanced feature propagation. Enhanced sparse MR image reconstruction reduces the MR image scanning time.

It is to be understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the specification is not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the specification may include only some of the described embodiments. Accordingly, the specification is not to be seen as limited by the foregoing description, but is only limited by the scope of the appended claims.

The invention claimed is:

1. A method, comprising:
    acquiring coil data from a magnetic resonance imaging device, wherein the coil data comprises undersampled k-space data corresponding to a subject;
    processing the coil data using an image reconstruction technique to generate an initial undersampled image; and
    generating a reconstructed image based on the coil data, the initial undersampled image, and a plurality of iterative blocks of a flared network, wherein a first iterative block of the flared network receives the initial undersampled image, and wherein each of the plurality of iterative blocks comprises a data consistency unit and a regularization unit and wherein the iterative blocks are connected both by direct connections from one iterative block to the following iterative block and by a plurality of dense skip connections to non-adjacent iterative blocks, and wherein the flared network is based on a neural network trained using previously acquired coil data.

2. The method of claim 1, further comprising:
    receiving previously acquired substantially fully-sampled coil data from a database unit;
    reconstructing the substantially fully-sampled coil data to generate ground truth images corresponding to the previously acquired coil data;
    retrospectively undersampling the substantially fully-sampled coil data to generate corresponding input data to the flared network;
    determining a plurality of parameters corresponding to the data consistency unit and the regularization unit of the plurality of iterative blocks by training the flared network to create output images that are similar to the corresponding ground truth images; and
    storing the trained flared network in the database unit.

3. The method of claim 1, wherein the initial undersampled image is a complex composite image.

4. The method of claim 1, wherein generating the reconstructed image comprises preserving fidelity of the coil data in output of each of the plurality of iterative blocks based on a corresponding data consistency unit.

5. The method of claim 1, wherein generating the reconstructed image comprises generating regularization information to reduce generalization error in output of each of the plurality of iterative blocks based on a corresponding regularization unit.

6. The method of claim 5, wherein generating the regularization information comprises processing a plurality of inputs from the dense skip connections and from an immediately preceding iterative block using a convolutional network, wherein the convolutional network comprises a plurality of convolution layers, a plurality of bias layers and a plurality of leaky ReLU layers.

7. The method of claim 6, wherein dense skip connections fan forward from outputs of each of at least some of the iterative blocks to a predetermined number of subsequent iterative blocks beyond the respective following iterative block.

8. The method of claim 6, wherein output from one or more of the plurality of iterative blocks is based on five skip inputs.

9. The method of claim 6, wherein generating the reconstructed image comprises generating intermediate feature maps for each of the plurality of iterative blocks.

10. The method of claim 1, wherein generating the reconstructed image comprises:
    acquiring the coil data from eight receiver coils with an undersampling factor of four; and
    processing the coil data using a flared network having sixteen iterative blocks, each iterative block comprising five convolution layers and each convolution layer comprising twelve filters.

11. A system, comprising:
    a database unit configured to store a flared network comprising a plurality of iterative blocks and previously acquired coil data, wherein each of the plurality of iterative blocks comprises a data consistency unit and a regularization unit and wherein the iterative blocks are connected both by direct connections from one iterative block to the following iterative block and by a plurality of dense skip connections to non-adjacent iterative blocks, and wherein the flared network is based on a neural network trained using previously acquired coil data;
    a data acquisition unit configured to acquire coil data from a magnetic resonance imaging device, wherein the coil data comprises undersampled k-space data corresponding to a subject;
    an image processing unit communicatively coupled to the data acquisition unit and configured to:
        process the coil data using an image reconstruction technique to generate an initial undersampled image;
        generate a reconstructed image based on the coil data, the initial undersampled image, and the flared network, wherein a first iterative block of the flared network receives the initial undersampled image.

12. The system of claim 11, wherein the image processing unit is further configured to:
    receive previously acquired substantially fully-sampled coil data from a database unit;
    reconstruct the substantially fully-sampled coil data to generate ground truth images corresponding to the previously acquired coil data;
    retrospectively undersample the substantially fully-sampled coil data to generate corresponding input data to the flared network;
    determine a plurality of parameters corresponding to the data consistency unit and the regularization unit of the plurality of iterative blocks by training the flared network to create output images that are similar to the corresponding ground truth images; and
    store the trained flared network in the database unit.

13. The system of claim 11, wherein the initial undersampled image is a complex composite image.

14. The system of claim 11, wherein the flared network is configured to preserve fidelity of the coil data in output of each of the plurality of iterative blocks based on a corresponding data consistency unit.

15. The system of claim 11, wherein the flared network is configured to generate regularization information to reduce generalization error in output of each of the plurality of iterative blocks based on a corresponding regularization unit.

16. The system of claim 15, wherein the regularization unit is configured to process a plurality of inputs from the dense skip connections and from an immediately preceding iterative block using a convolutional network, wherein the convolutional network comprises a plurality of convolution layers, a plurality of bias layers and a plurality of leaky ReLU layers.

17. The system of claim 16, wherein the dense skip connections fan forward from output of each of at least some of the iterative blocks to a predetermined number of subsequent iterative blocks beyond the respective following iterative block.

18. The system of claim 16, wherein output from one or more of the plurality of iterative blocks is based on five skip inputs.

19. The system of claim 16, wherein the flared network is configured to generate intermediate feature maps for each of the plurality of iterative blocks.

20. The system of claim 11, wherein the flared network comprising sixteen iterative blocks, each iterative block comprising five convolution layers and each convolution layer comprising twelve filters is configured to process the coil data acquired from eight receiver coils with an undersampling factor of four.

* * * * *